United States Patent [19]

Graeve

[11] Patent Number: 5,122,988
[45] Date of Patent: Jun. 16, 1992

[54] DATA STREAM SMOOTHING USING A FIFO MEMORY

[75] Inventor: Egbert Graeve, Los Altos, Calif.

[73] Assignee: Schlumberger Tecnologies, Inc., San Jose, Calif.

[21] Appl. No.: 732,351

[22] Filed: Jul. 17, 1991

Related U.S. Application Data

[63] Continuation of Ser. No. 410,767, Sep. 21, 1989, abandoned.

[51] Int. Cl.⁵ .............................................. G11C 7/00
[52] U.S. Cl. .................................. 365/219; 365/221; 365/222; 365/230.08
[58] Field of Search ............ 365/219, 221, 222, 230.08

[56] References Cited

U.S. PATENT DOCUMENTS

| | | | |
|---|---|---|---|
| 4,631,701 | 12/1986 | Kappeler et al. | 365/222 |
| 4,642,797 | 2/1987 | Hoberman | 365/219 |
| 4,777,624 | 10/1988 | Ishizawa et al. | 365/222 |
| 4,882,710 | 11/1989 | Hashimoto et al. | 365/222 |
| 4,891,788 | 1/1990 | Kreifels | 365/230.08 |

*Primary Examiner*—Joseph E. Clawson, Jr.
*Attorney, Agent, or Firm*—Townsend and Townsend

[57] ABSTRACT

A data stream smoothing circuit wherein a FIFO memory receives data from the DRAM, and a memory status circuit provides a memory-full status signal when the FIFO memory contains a selected amount of data from the DRAM. A refresh timer generates a refresh request signal whenever DRAM refresh should be performed. When the refresh request signal is generated, a refresh control circuit refreshes a row of data in the DRAM upon occurrence of the next memory-full status signal.

16 Claims, 2 Drawing Sheets

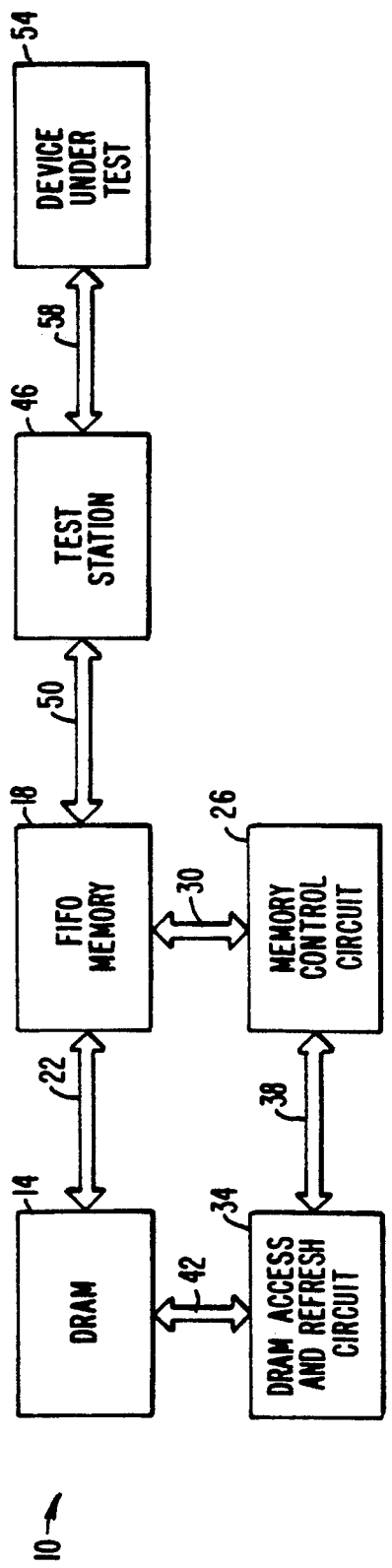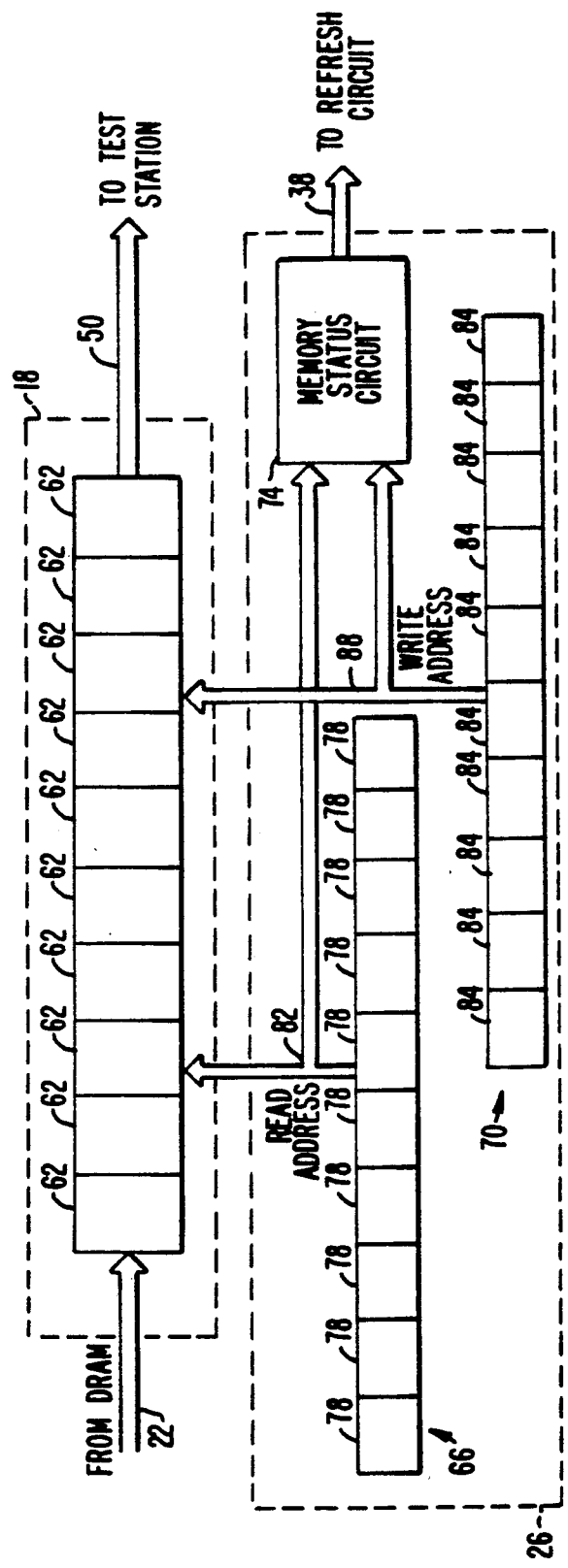

DATA STREAM SMOOTHING USING A FIFO MEMORY

This is a continuation of application Ser. No. 07/410,767, filed Sep. 21, 1989, now abandoned.

BACKGROUND OF THE INVENTION

1. Field of the Invention

This invention relates to integrated circuit testing devices, and more particularly to the use of a FIFO memory to promote uniform communication of test data from a dynamic random access memory (DRAM) to a device under test.

2. Description of the Related Art

As large scale integrated circuit (LSI) components become more complex, the need for larger local memory in LSI component testers increases accordingly. For example, state of the art LSI component testers must have the capability of storing up to eight million or more vectors in local memory. The increase is caused by the ever increasing length of test patterns for complex devices, especially those which are CAD generated. Because of such memory requirements, it is desirable to use dynamic random access memories (DRAM's) as the components used in building the local memories because they provide the largest amount of storage per dollar.

One obstacle which must be overcome when using DRAM's for test data is that they need to be refreshed periodically, and this requirement interferes with the need for a continuous data stream by the testing unit. In the past, this problem has been overcome by using two buffers between local memory and the test station. One buffer is loaded from local memory, while the other one is emptied out. By the time the second buffer is empty, the first has been filled. Thereafter, the first buffer is emptied while the second buffer is being filled. See U.S. Pat. No. 4,451,918 issued to Gillette. However, this solution requires a substantial amount of duplication of circuitry and complex control circuitry.

Another obstacle which must be overcome when using DRAMS for test data is that a DRAM running in one of the fast access modes (e.g., static column mode, page mode. nibble mode, etc.) can do only a limited number of fast accesses before it must revert to a normal, slower write or read cycle. For example, when a 256k × 4 DRAM is accessed in static column mode, a longer access time results every time a new row is addressed, i.e., after 512 cycles (row × column = 512 × 512 =256k). While the static column mode cycles can be 60 ns, the longer cycle which occurs when crossing a row boundary is at least twice as long. This amounts to a break in the smooth data stream.

SUMMARY OF THE INVENTION

The present invention is directed to the use of a FIFO memory for communicating data from a DRAM to a testing device in a continuous data stream despite interruptions for refresh cycles or long memory access cycles. Unnecessary duplication of circuitry is eliminated, together with the added control circuitry required of such duplicate systems.

In one embodiment of the present invention, a FIFO memory receives data from the DRAM. and a memory status circuit provides a memory-full status signal when the FIFO memory contains a selected amount of data from the DRAM. A refresh timer generates a refresh request signal whenever DRAM refresh should be performed. When the refresh request signal is generated, a refresh control circuit refreshes a row of data in the DRAM upon occurrence of the next memory-full status signal.

BRIEF DESCRIPTION OF THE DRAWINGS

FIG. 1 is a block diagram of a particular embodiment of an LSI testing device according to the present invention.

FIG. 2 is a block diagram of a particular embodiment of the FIFO memory and memory status circuit shown in FIG. 1.

DETAILED DESCRIPTION OF THE PREFERRED EMBODIMENTS

Figure 3:
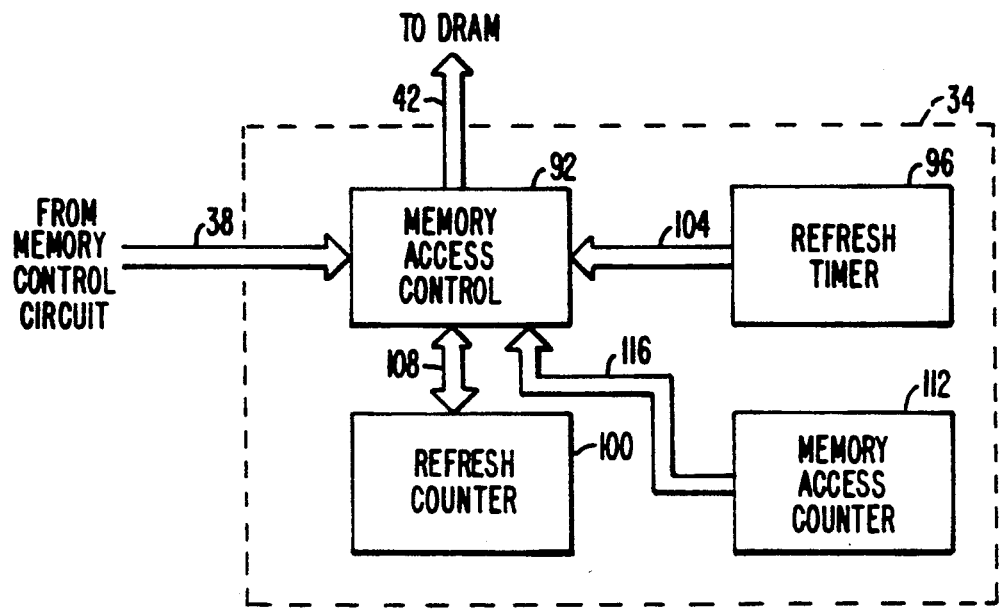
FIG. 3 is a block diagram of a particular embodiment of the DRAM access and refresh circuit shown in FIG. 1.

FIG. 1 is a block diagram of a memory test system 10 according to the present invention. Test system 10 includes a DRAM 14 for storing data used in the testing process, a FIFO memory 18 for receiving the data from DRAM 14 over a bus 22, a memory control circuit 26 which communicates with FIFO memory 18 over a bus 30 for monitoring the status of FIFO memory 18, and a DRAM address/refresh circuit 34 for receiving FIFO memory status information from memory control circuit 26 over a bus 38 and for controlling the addressing and refresh of DRAM 14 through a bus 42. The data in FIFO memory 18 is communicated to a test station 46 over a bus 50 at a substantially uninterrupted rate. Test station 46 formats the data from FIFO memory 18 and communicates the formatted data to a device under test 54 over a bus 58 for testing the device.

FIG. 2 is a more detailed block diagram of FIFO memory 18 and memory control circuit 26. In the preferred embodiment, FIFO memory 18 comprises a plurality of latches 62 for moving data from DRAM 14 to test station 46. Memory control circuit 26 comprises a read address register 66, a write address register 70 and a memory status circuit 74. Read address register 66 comprises a plurality of flip-flops 78 which are interconnected to form a shifter wherein the output of the last flip-flop is coupled to the input of the first flip-flop so that a binary sequence may be shifted in a continuous ring. In this embodiment, only one active bit (a one) exists in the address register at any one time, and the remaining bits are all zero. There is one flip-flop 78 per latch 62 in FIFO memory 18, and the flip-flop which contains the active bit determines which latch 62 has been read most recently. The bit configuration in read address register 66 is communicated to memory status circuit 74 over a bus 82.

Write address register 70 comprises a plurality of flip-flops 84 which are connected together and function in the same way as read address register 66. In this case, the single active bit within write address register 70 corresponds to the most recently written to latch 62 in FIFO memory 18. The bit configuration of write address register 70 is communicated to memory status circuit 74 over a bus 88. Buses 82 and 88 form a part of bus 30 in FIG. 1.

Memory status circuit 74 receives the bit patterns from read address register 66 and write address register 70 and determines, from the relative location of the most recently read from and written to latches, the state of FIFO memory 18. In particular, memory status circuit 74 determines whether or not FIFO memory is "full" through the use of suitable combinational logic. In this embodiment, FIFO memory 18 is full whenever 8, 9 or 10 latches 62 in FIFO memory 18 contain data that has yet to be sent to test station 46. When memory status circuit 74 determines that FIFO memory 18 is full, it provides a memory-full status signal on bus 38 to DRAM access/refresh circuit 34.

Figure 4:
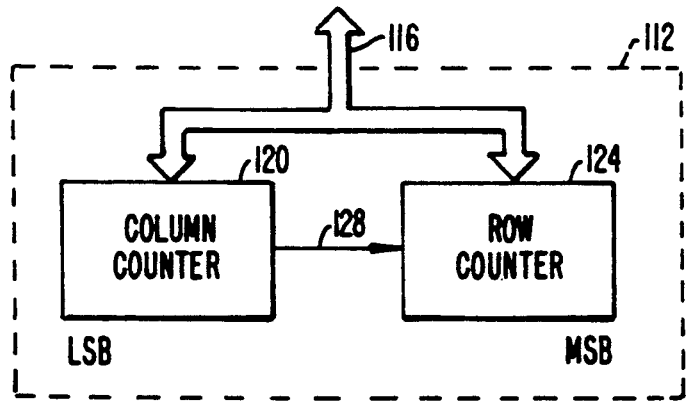
FIG. 4 is a block diagram of a particular embodiment of the memory access counter shown in FIG. 3.

FIG. 3 is a more detailed block diagram of DRAM access/refresh circuit 34. DRAM access/refresh circuit 34 comprises a memory access control circuit 92, a refresh timer 96, a refresh counter 100 and a memory access counter 112. Refresh timer 96 provides a "refresh due" signal on a bus 104 whenever DRAM 14 should be refreshed. The time interval after which the refresh due signal is generated typically is determined by the size of the DRAM and the amount of time by which the entire DRAM must be refreshed. For example, if the entire memory must be refreshed every eight milliseconds, and if the DRAM contains 512 rows of data, then a refresh due signal must be generated at least 512 times within the eight millisecond period. Refresh counter 100 is a modulo-n counter where n equals the number of rows in DRAM 14. The value of refresh counter 100 is communicated to memory access control circuit 92 over a bus 108 for sequentially refreshing each row in DRAM 14. Memory access counter 112 provides DRAM address signals to memory access control circuit 92 over a bus 116. As shown in FIG. 4, memory access counter 112 comprises a column counter 120 and a row counter 124. Column counter 120 provides the least significant bits (LSB's) of the DRAM address, and row counter 124 provides the most significant bits (MSB's) of the DRAM address. Row counter 124 operates in response to carry-out signals received from column counter 120 over a bus 128. The values of column counter 120 and row counter 124 are output on bus 116.

In operation, memory access control circuit 92 generates DRAM read accesses in response to address signals received over bus 116 whenever FIFO memory 18 is less than full. Additionally, memory access control circuit 92 operates to refresh DRAM 14 in response to the memory status signal received from bus 38, the refresh due signal received from bus 104, and the row address received on bus 108. When a refresh due signal is received from refresh timer 96, memory access control 92 waits until the appropriate memory-full signal is received from memory control circuit 26. When this occurs, memory access control 92 refreshes the row in DRAM 14 addressed by row counter 100, typically by performing a memory access to that location.

In this manner, data may be communicated from DRAM 14 to FIFO memory 18 at the DRAM data rate and thereafter read out of FIFO memory 18 at the rate required by test station 46, even if the two data rates are different. Data is communicated from DRAM 14 to FIFO memory 18 as long as FIFO memory is less than full. Refresh accesses are allowed when FIFO memory 18 is full.

While the above is a complete description of a preferred embodiment of the present invention, various modifications may be employed. For example, the FIFO can also be used for DRAM loading with a higher data source rate uninterrupted by refresh requests. In this case the FIFO is filled at a constant rate, and the FIFO logic generates DRAM write accesses whenever the FIFO is more than empty. This manner of loading local memory allows the use of a synchronous source bus, and no handshakes are required. Consequently, the scope of the invention should not be limited except as described in the claims.

What is claimed is:

1. A data communicating circuit for providing a continuous stream of data from a DRAM which is periodically refreshed by a refresh circuit comprising:

a FIFO memory;

DRAM communicating means, coupled to the DRAM and to the FIFO memory, for communicating data from the DRAM to the FIFO memory;

memory status means, associated with the FIFO memory, for providing a memory full signal when the FIFO memory contains a selected amount of data from the DRAM;

refresh means, coupled to the DRAM, for refreshing the DRAM, the refresh means comprising:

a refresh timer for providing a refresh due signal at fixed periodic time intervals;

a refresh counter for sequentially providing DRAM row address values; and refresh control means, coupled to the refresh timer, to the refresh counter, and to the memory status means, for refreshing the DRAM row indicated by the refresh counter when the memory full signal and the refresh due signal are simultaneously present.

2. The circuit according to claim 1 wherein the refresh control means refreshes a single row of data in the DRAM when the refresh due signal and the memory full signal are simultaneously present.

3. The circuit according to claim 1 wherein the memory status means comprises:

read indicating means for serially indicating a value corresponding to a recently read storage element in the FIFO memory;

write indicating means for serially indicating a value corresponding to a recently written storage element in the FIFO memory; and logic means, coupled to read indicating means and to the write indicating means, for providing the memory full signal in response to the values indicated by the read indicating means and the write indicating means.

4. The circuit according to claim 3 wherein the said indicating means comprises a plurality of serially connected flip-flops forming a first shifter including a first flip-flop and a last flip-flop, an output terminal of the last flip-flop being coupled to an input terminal of the first flip-flop so that a binary sequence may be shifted in a continuous ring, and wherein only one active bit exists in the first shifter at any one time.

5. The circuit according to claim 4 wherein each flip-flop in the first shifter corresponds to a memory element in the FIFO memory, and wherein the active bit for the first shifter resides in the first shifter flip-flop corresponding to the most recently read memory element.

6. The circuit according to claim 4 wherein the write indicating means comprises a plurality of serially connected flip-flops forming a second shifter including a first flip-flop and a last flip-flop, an output terminal of the last flip-flop being coupled to an input terminal of the first flip-flop so that a binary sequence may be shifted in a continuous ring, and wherein only one active bit exists in the second shifter at any one time.

7. The circuit according to claim 6 wherein each flip-flop in the second shifter corresponds to a memory element in the FIFO memory, and wherein the active bit for the second shifter resides in the second shifter flip-flop corresponding to the most recently written memory element.

8. The circuit according to claim 3 wherein the FIFO memory comprises ten memory elements, and wherein the memory status means provides the memory full signal when eight, nine, or ten memory elements contain data.

9. A method for providing a continuous stream of data from a DRAM which is periodically refreshed by a refresh circuit comprising the steps of:
communicating data from the DRAM to the FIFO memory;
providing a memory full signal when the FIFO memory contains a selected amount of data from the DRAM;
providing a refresh due signal at fixed periodic time intervals;
sequentially providing DRAM row address values with a refresh counter; and
refreshing the DRAM row indicated by the refresh counter when the memory full signal and the refresh due signal are simultaneously present.

10. The method according to claim 9 wherein the refreshing step comprises the step of refreshing a single row of data in the DRAM when the refresh due signal and the memory full signal are simultaneously present.

11. The method according to claim 10 wherein the memory full signal providing step comprises:
serially indicating a first value corresponding to a recently read storage element in the FIFO memory;
serially indicating a second value corresponding to a recently written storage element in the FIFO memory; and
providing the memory full signal in response to the values indicated by the read indicating means and the write indicating means.

12. The method according to claim 11 wherein the first value indicating step comprises the step of shifting a plurality of binary signals containing only one read active bit through a plurality of read signal positions forming a continuous ring.

13. The method according to claim 12 wherein each read signal position corresponds to a memory element in the FIFO memory, and wherein the read active bit resides in the read signal position corresponding to the most recently read memory element.

14. The method according to claim 12 wherein the second value indicating step comprises the step of shifting a plurality of binary signals containing only one write active bit through a plurality of write signal positions forming a continuous ring.

15. The method according to claim 14 wherein each write signal position corresponds to a memory element in the FIFO memory, and wherein the write active bit resides in the write signal position corresponding to the most recently written memory element.

16. The method according to claim 11 wherein the FIFO memory comprises ten memory elements, and wherein the memory full signal providing step comprises the step of providing the memory full signal when eight, nine, or ten memory elements contain data.

* * * * *